United States Patent
Wang et al.

(10) Patent No.: US 6,187,655 B1
(45) Date of Patent: Feb. 13, 2001

(54) METHOD FOR PERFORMING A PRE-AMORPHIZATION IMPLANT (PAI) WHICH PROVIDES REDUCED RESIST PROTECT OXIDE DAMAGE AND REDUCED JUNCTION LEAKAGE

(75) Inventors: Jiann-Jong Wang, Tao-Yuan; Ding-Dar Hu, Taichung; Horng-Jer Hsiue, Chiao-Yi; Ching-Kunn Huang, Hsin-Chu, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/374,299

(22) Filed: Aug. 16, 1999

(51) Int. Cl.$^7$ .................................................. H01L 21/425
(52) U.S. Cl. .......................... 438/528; 438/592; 438/593
(58) Field of Search ..................... 438/306, 528, 438/241, 224, 373, 515, 258, 592, 952

(56) References Cited

U.S. PATENT DOCUMENTS

| | | |
|---|---|---|
| 4,635,347 | 1/1987 | Lien et al. ............................. 29/591 |
| 5,605,854 | 2/1997 | Yoo ........................................ 437/44 |
| 5,656,546 | 8/1997 | Chen et al. ........................... 438/586 |
| 5,920,774 | * 7/1999 | Wu ........................................ 435/224 |
| 6,004,843 | * 12/1999 | Huang .................................. 438/241 |
| 6,054,357 | * 4/2000 | Choi ..................................... 438/306 |

* cited by examiner

*Primary Examiner*—David Nelms
*Assistant Examiner*—Dung A Le
(74) *Attorney, Agent, or Firm*—George O. Saile; Stephen B. Ackerman; William J. Stoffel

(57) ABSTRACT

The present invention provides a method for performing a pre-amorphization implant which reduces damage to the resist protect oxide layer and reduces leakage current between the gate and substrate. Two novel approaches are provided, both of which use a photoresist mask to protect the RPO from implant damage during PAI. In the first approach, the PAI is performed immediately after RPO etching to form contact openings. Thus the original photoresist mask is still on the RPO. In the second approach, the photoresist mask is re-formed prior to PAI to protect the RPO from implant damage.

12 Claims, 2 Drawing Sheets

METHOD FOR PERFORMING A PRE-AMORPHIZATION IMPLANT (PAI) WHICH PROVIDES REDUCED RESIST PROTECT OXIDE DAMAGE AND REDUCED JUNCTION LEAKAGE

BACKGROUND OF INVENTION

1) Field of the Invention

This invention relates generally to fabrication of semiconductor devices and more particularly to performing a pre-amorphization implant (PAI) during a salicide process.

2) Description of the Prior Art

Self-aligned silicide (salicide) formation is widely used in semiconductor manufacting. It is well known that salicide formation is enhanced by doping the silicon region on which salicide formation will occur. This doping process is known as pre-amorphization implant (PAI). PAI is widely, used in 0.25 μm devices. However, if the salicide process parameters are not precisely controlled, voids can form in the resist protect oxide (RPO) resulting in juction leakage. As PAI energy increases and/or pre-metal dip time increases RPO voids increase.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 4,635,347 (Lein et al.) shows a self-aligned $TiSi_x$ gate and contact forming process.

U.S. Pat. No. 5,605,854 (Yoo) shows a $TiSi_x$ process.

U.S. Pat. No. 5,656,546 (Chen et al.) shows a self-aligned $TiN/TiSi_x$ process.

SUMMARY OF THE INVENTION

It is an object of the present invention to provide a method of performing a pre-amorphization implant (PAI) which reduces damage to the resist protect oxide (RPO).

It is another object of the present invention to provide a method of performing a pre-amorphization implant (PAI) which reduces leakage current in the RPO.

It is another object of the present invention to provide a method of performing a pre-amorphization implant (PAI) which reduces salicide spiking on the RPO.

It is yet another object of the present invention to provide a method for forming a self-aligned silicide contact using the aforementioned novel PAI process.

To accomplish the above objectives, the present invention provides a method for performing a pre-amorphization implant which reduces damage to the resist protect oxide layer and reduces leakage current between the gate and substrate. Two novel approaches are provided, both of which use a photoresist mask to protect the RPO from implant damage during PAI. In the first approach, the PAI is performed immediately after RPO etching to form contact openings. Thus the original photoresist mask is still on the RPO. In the second approach, the photoresist mask is re-formed prior to PAI to protect the RPO from implant damage.

The present invention provides considerable improvement over the prior art. The photoresist mask (16) overlying the resist protect oxide (14) prevents impurity ions (20) from penetrating the resist protect oxide layer (14). When ions are implanted into the resist protect oxide (14), they cause damage to the resist protect oxide (14), resulting in voids. During the subsequent salicide step, silicide spikes are formed in the voids causing junction leakage. Thus, the present invention reduces junction leakage.

Also, since the present invention prevents implant damage to the RPO, the PAI of the present invention can accomodate a greater range of the implant energy. A greater range in pre-metal dip can also be tolerated in the present invention, since implant damage to the RPO is prevented.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for performing a pre-amorphization implant which reduces damage to the resist protect oxide layer and reduces leakage current between the gate and substrate.

First Embodiment

Figure 1:
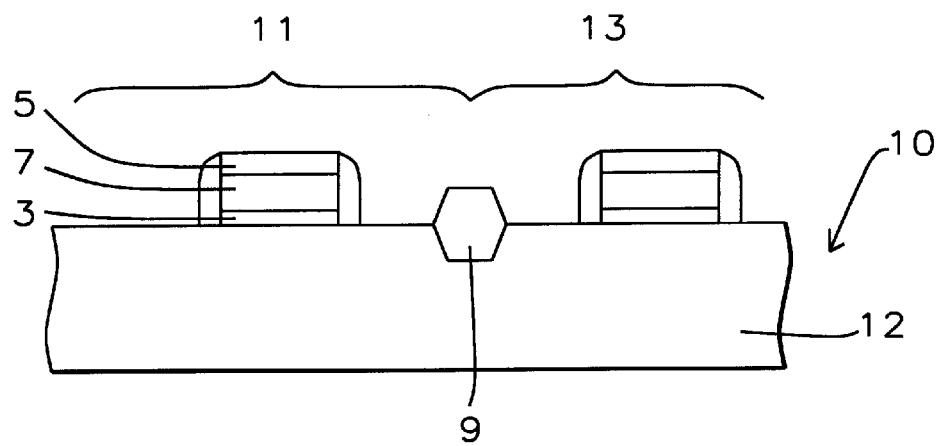
FIGS. 1, 2, 3 & 4 illustrate sequential sectional views of a process for performing a pre-amorphization implant which reduces damage to the resist protect oxide layer and reduces leakage current between the gate and substrate.

Referring to FIG. 1, a semiconductor structure (10) is provided. The semiconductor structure (10) can comprise a semiconductor substrate (12) with one or more devices formed thereon. Preferably, the semiconductor substrate (12) comprises a first area (11) and a second area (13) separated by a shallow trench isolation (9). The semiconductor substrate (10) may have one or more gates thereon comprising a gate oxide layer (3), a gate electrode (5), and sidewall spacers (7).

Figure 2:
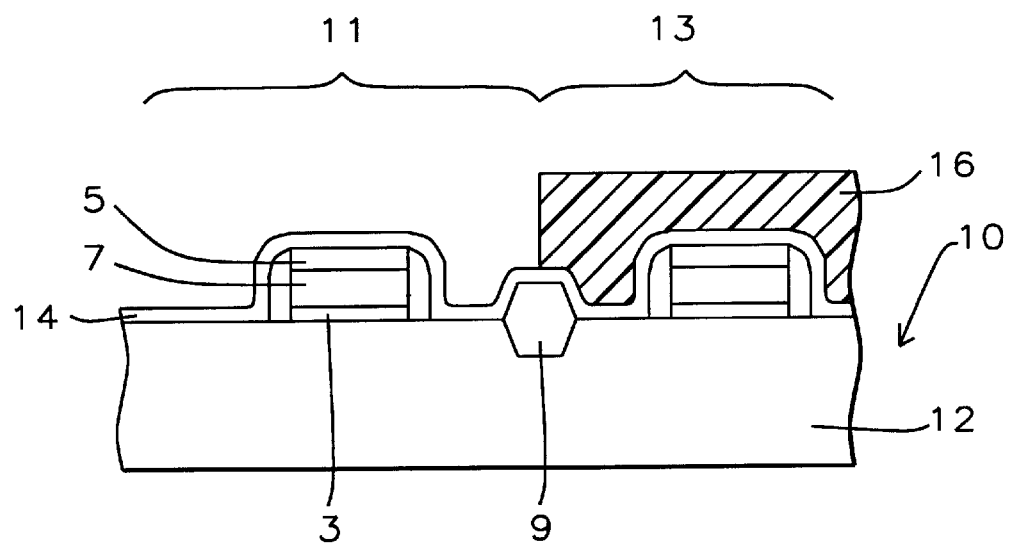

Referring to FIG. 2, a resist protect oxide layer (14) is deposited on the semiconductor structure (10). The resist protect oxide layer (14) can be deposited using LPCVD, CVD, or most preferably plasma enhanced chemical vapor deposition (PECVD). The resist protect oxide layer (14) preferably has a thickness of between about 300 Angstroms and 500 Angstroms.

Still referring to FIG. 2, a photoresist mask (16) is formed on the resist protect oxide layer (14) over the second area (13) of the semiconductor substrate (12) using conventional photolithography techniques. The photoresist mask (16) preferably has a thickness of between about 10000 Angstroms and 15000 Angstroms.

Still referring to FIG. 2, the resist protect oxide layer (14) is etched to form contact openings (18) over the first area (11) of the semiconductor substrate (12) which is not covered by the photoresist mask (16). The resist protect oxide is preferably etched using a dry etch process with $CHF_3/CF_4$.

Figure 3:
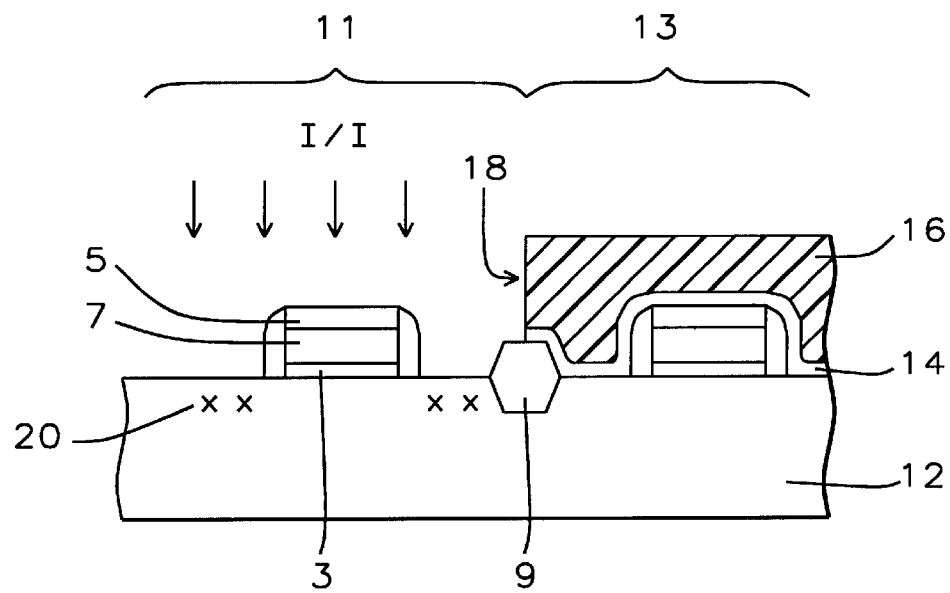

Referring to FIG. 3, impurity ions (20) are implanted into the semiconductor substrate (12) through the contact openings (18). The impurity ion species can be silicon (Si), germanium (Ge), or most preferably arsenic (As). For As, the implant energy is between about 20 KeV and 40 KeV, and the dose is between about 2.0E14 atm/cm² and 4.0E14 atm/cm².

A key advantage of the present invention is that the photoresist mask (16) prevents impurity ions (20) from penetrating the resist protect oxide layer (14). When ions are implanted into the resist protect oxide (14), they cause damage to the resist protect oxide (14), resulting in voids. During the subsequent salicide step, silicide spikes are formed in the voids causing junction leakage. Thus, the present invention reduces junction leakage.

Figure 4:
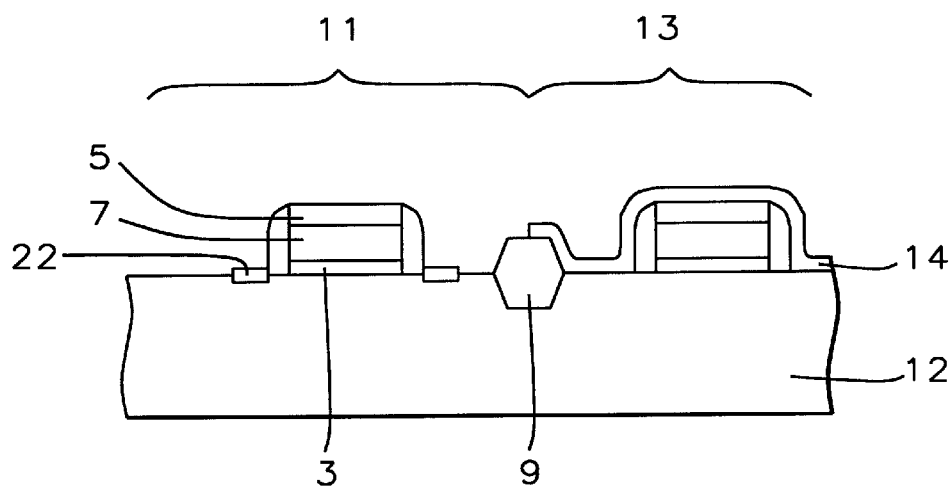

Referring to FIG. 4, the photoresist mask (16) is removed using conventional photoresist stripping techniques.

Still referring to FIG. 4, self-aligned silicide regions (22) are formed in the contact openings (18) using a conventional salicide process.

Second Embodiment

Alternatively, the photoresist mask (16) can be removed following the resist protect oxide (14) etch to form contact openings (18). After the photoresist mask (16) is removed, a second photoresist mask (not shown) is formed having the same pattern and location as photoresist mark (16). The key advantage to the second embodiment of the present invention is that polymer build-up is removed.

Again, the photoresist mask (16) prevents impurity ions (20) from penetrating the resist protect oxide layer (14). Therefore junction leakage is reduced.

While the invention has been particularly shown and described with reference to the preferred embodiments thereof, it will be understood by those skilled in the art that various changes in form and details may be made without departing from the spirit and scope of the invention. For example, although N-type devices are described, it is well known by one skilled in the art that a P-type device can be formed according to the present invention by reversing polarities.

The main steps of the preferred emobiments of the present invention are listed in order in table 1.

TABLE 1

| embodiment 1 | embodiment 2 |
| --- | --- |
| resist protect oxide layer deposit | resist protect oxide layer deposit |
| resist protect oxide photo | resist protect oxide photo |
| resist protect oxide etch | resist protect oxide etch |
| pre-amorphous implant | resist protect oxide photoresist strip |
| resist protect oxide photoresist strip | resist protect oxide photo |
| pre-salidation metal dip | pre-amorphous implant; and |
| Ti/TiN deposit | resist protect oxide photoresist strip. |
| first rapid thermal anneal | pre-salidation metal dip |
| selectively remove unreacted Ti/TiN | Ti/TiN deposit |
| second rapid thermal anneal | first rapid thermal anneal |
| | selectively remove unreacted Ti/TiN |
| | second rapid thermal anneal |

What is claimed is:

1. A method for performing a pre-amorphization implant which reduces damage to a resist protect oxide layer and reduces leakage current between a gate and substrate comprising the steps of:
   a. depositing a resist protect oxide layer on a semiconductor structure; said semiconductor structure comprising a semiconductor substrate;
   b. forming a photoresist mask on said resist protect oxide layer;
   c. etching said resist protect oxide layer to form contact openings over areas not covered by said photoresist mask;
   d. implanting pre-amorphization impurity ions into said semiconductor substrate; whereby said photoresist mask prevents said impurity ions from penetrating said resist protect oxide layer;
   e. removing said photoresist mask; and
   f. forming self-aligned silicide regions in said contact openings.

2. The method of claim 1 wherein said semiconductor structure comprises a MOSFET device on a silicon substrate.

3. The method of claim 1 wherein said resist protect oxide layer is formed using a plasma enhanced chemical vapor deposition process.

4. The method of claim 1 wherein said resist protect oxide layer has a thickness of between about 300 Angstroms and 500 Angstroms.

5. The method of claim 1 wherein said photoresist mask has a thickness of between about 10000 Angstroms and 15000 Angstroms.

6. The method of claim 1 wherein said impurity ions are implanted at an energy of between about 20 KeV and 40 KeV and at a dose of between 2E14 atm/cm² and 4E14 atm/cm².

7. A method for performing a pre-amorphization implant which reduces damage to a resist protect oxide layer and reduces leakage current between a gate and substrate comprising the steps of:
   a. depositing a resist protect oxide layer on a semiconductor structure; said semiconductor structure comprising a semiconductor substrate;
   b. forming a first photoresist mask on said resist protect oxide layer;
   c. etching said first resist protect oxide layer to form contact openings over areas not covered by said photoresist mask;
   d. removing said first photoresist mask;
   e. forming a second photoresist mask having the same pattern and location as said first photoresist mask;
   f. implanting pre-amorphization impurity ions into said semiconductor substrate; whereby said photoresist mask prevents said impurity ions from penetrating said resist protect oxide layer;
   g. removing said second photoresist mask; and
   h. forming self-aligned silicide regions in said contact openings.

8. The method of claim 7 wherein said semiconductor structure comprises a MOSFET device on a silicon substrate.

9. The method of claim 7 wherein said resist protect oxide layer is formed using a plasma enhanced chemical vapor deposition process.

10. The method of claim 7 wherein said resist protect oxide layer has a thickness of between about 300 Angstroms and 500 Angstroms.

11. The method of claim 7 wherein said photoresist mask has a thickness of between about 10000 Angstroms and 15000 Angstroms.

12. The method of claim 7 wherein said impurity ions are implanted at an energy of between about 20 KeV and 40 and at a dose of between 2E14 atm/cm² and 4E14 atm/cm².

* * * * *